United States Patent [19]

Itano et al.

[11] Patent Number: 4,893,033
[45] Date of Patent: Jan. 9, 1990

[54] PROGRAMMABLE LOGIC ARRAY HAVING INPUT TRANSITION DETECTION FOR GENERATING PRECHARGE

[76] Inventors: Kiyoshi Itano, 477-102, Shimokodanaka, Nakahara-ku, Kawasaki-shi, Kanagawa, 211; Kohji Shimbayashi, 979, Kamikodanaka, Nakahara-ku, Kawasaki-shi, Kanagawa, 211 both of Japan

[21] Appl. No.: 253,515

[22] Filed: Oct. 5, 1988

[30] Foreign Application Priority Data

Oct. 6, 1987 [JP] Japan .................. 62-251980

[51] Int. Cl.$^4$ ............... H03K 17/04; H03K 19/017
[52] U.S. Cl. ................................. 307/465; 307/443; 307/469; 307/481
[58] Field of Search ............ 307/443, 465, 448, 452, 307/468–469, 480–481; 364/716

[56] References Cited

U.S. PATENT DOCUMENTS

| | | | |
|---|---|---|---|
| 4,577,190 | 3/1986 | Law | 307/465 X |
| 4,697,105 | 9/1987 | Moy | 307/443 X |
| 4,740,721 | 4/1988 | Chung et al. | 307/452 X |
| 4,760,290 | 7/1988 | Martinez | 307/443 X |
| 4,769,562 | 9/1988 | Ghisio | 307/465 X |
| 4,831,285 | 5/1989 | Gaiser | 307/469 X |
| 4,839,539 | 6/1989 | Takata et al. | 307/465 |

FOREIGN PATENT DOCUMENTS

| | | |
|---|---|---|
| 61256 | 5/1976 | Japan . |
| 61257 | 5/1976 | Japan . |
| 502091 | 9/1986 | Japan . |
| 190926 | 8/1987 | Japan . |

*Primary Examiner*—David Hudspeth
*Attorney, Agent, or Firm*—Armstrong, Nikaido, Marmelstein, Kubovcik & Murray

[57] ABSTRACT

A programmable logic array circuit includes a pulse signal generating circuit for generating a pulse signal by detecting a change in levels of input signals. A first transistor for precharging a product term line is provided. A second transistor is provided for discharging an OR array input line. A third transistor is provided for precharging an OR array output line. The first through third transistors are controlled by the pulse signal. In other words, the first through third transistors are controlled in response to the signal change of the input signals. In order to facilitate the discharging operation with respect to the OR array input line, a fourth transistor may be provided on a side opposite to the second transistor.

13 Claims, 12 Drawing Sheets

PROGRAMMABLE LOGIC ARRAY HAVING INPUT TRANSITION DETECTION FOR GENERATING PRECHARGE

BACKGROUND OF THE INVENTION

The present invention generally relates to a programmable logic array circuit, and in particular to an improvement of a circuit structure of a programmable logic array circuit.

As is well known, a static random access memory (SRAM) or an erasable programmable read only memory (EPROM) is driven by an address transition detect pulse (ATD pulse) in order to speed up a logic operation thereof. On the other hand, a conventional programmable logic array circuit (hereafter simply referred to as PLA circuit) is driven by two different pulse signals having mutually different phases. This is because the PLA is divided into two parts of an AND array and an OR array. The AND array is driven by one pulse signal and the OR array is driven by the other pulse signal. The above PLA is disclosed in the following publication: T. Sasao, "HOW TO CONSTRUCT AND USE A PLA", Nikkan Kogyo Shinbunsha, pp. 19.

Alternatively, a PLA which is driven by a single pulse signal is proposed: see the Japanese Laid-Open Patent Application No. 51-61256. The disclosed PLA is a dynamic PLA circuit constructed by n-channel metal oxide semiconductor transistors (hereafter simply referred to as n-channel CMOSs). The PLA contains flip-flops for temporarily holding outputs of corresponding product (AND) term lines, and other flip-flops for temporarily holding outputs of OR output term lines. These flip-flops are driven by the single pulse signal.

However, the conventional PLA circuit driven by two different clock signals has the following disadvantages. First, the two different pulse signals must have a constant phase difference which amounts to a time taken for an output of the AND array to become stabilized or settled. For this reason, there is a limit on the operation speed of the PLA. Secondly, in case where the two different clock signals become out of phase, an erroneous operation may be caused and further the yield rate of production of the PLA circuit may be decreased. Thirdly, the two different clock signals are generated by an external circuit irrespective of timing at which input signals are applied to the AND array. This is inconvenient in practical use, and leads to an decrease of the operation speed.

The conventional PLA circuit driven by the single pulse signal has disadvantages described below. First, the size of the PLA circuit cannot be considerably reduced, because a number of flip-flops must be used. Further, the single pulse signal is generated by an external circuit irrespective of timing at which input signals are supplied to the AND array. Therefore, the input signals may be supplied to the AND array before corresponding product term lines are completely charged up. This may cause an erroneous operation and reduce the operation speed.

SUMMARY OF THE INVENTION

Accordingly, a general object of the present invention is to provide a programmable logic array circuit in which the disadvantages are eliminated.

A more specific object of the present invention is to provide a programmable logic array circuit which is driven by a single pulse signal which is generated from input signals to be supplied thereto. In other words, the single pulse signal is generated by an internal or built-in pulse generating circuit.

Another object of the present invention is to provide a programmable logic array circuit in which product (AND) term lines extending from an AND array are precharged in response to the clock signal generated by the built-in pulse generating circuit. With this structure, output logics of the product term lines can be stabilized rapidly.

Yet another object of the present invention is to provide a programmable logic array circuit in which OR output term lines extending from an OR array are precharged during EPROM cells contained in the OR array are discharged.

The above objects of the present invention are achieved by a programmable logic array circuit comprising the following elements in addition to an AND array and an OR array. The AND array includes a plurality of memory cells connected to input lines and product term lines. Input signals are supplied to the AND array through the input lines. The OR array comprises a plurality of memory cells connected to OR array input lines and OR array output lines. Output signals are extracted through the OR array output lines. A pulse signal generating circuit generates a pulse signal by detecting a change in levels of the input signals. A product term sensing buffer circuit senses levels of the product term lines. Sensed levels are sent to the OR array through the OR array input lines. The product term sensing buffer circuit includes a first precharging transistor for charging the product term lines up to a predetermined potential in response to the pulse signal derived from the pulse signal generating means, and a discharging transistor for discharging the OR array input lines in response to the pulse signal derived from the pulse signal generating circuit. A discharging transistor discharges the OR array input lines in response to the pulse signal derived from the pulse signal generating circuit. A second precharging circuit charges the OR array input lines up to a predetermined potential in response to the pulse signal derived from the pulse signal generating circuit. It is preferable to provide a second discharging transistor for discharging the OR array input lines in order to facilitate the discharging operation with respect thereto.

Other objects, features and advantages of the present invention will become apparent from the following detailed description when read in conjunction with the accompanying drawings.

DETAILED DESCRIPTION

To facilitate the understanding of the present invention, a description is given of conventional PLA circuits.

Figure 1:
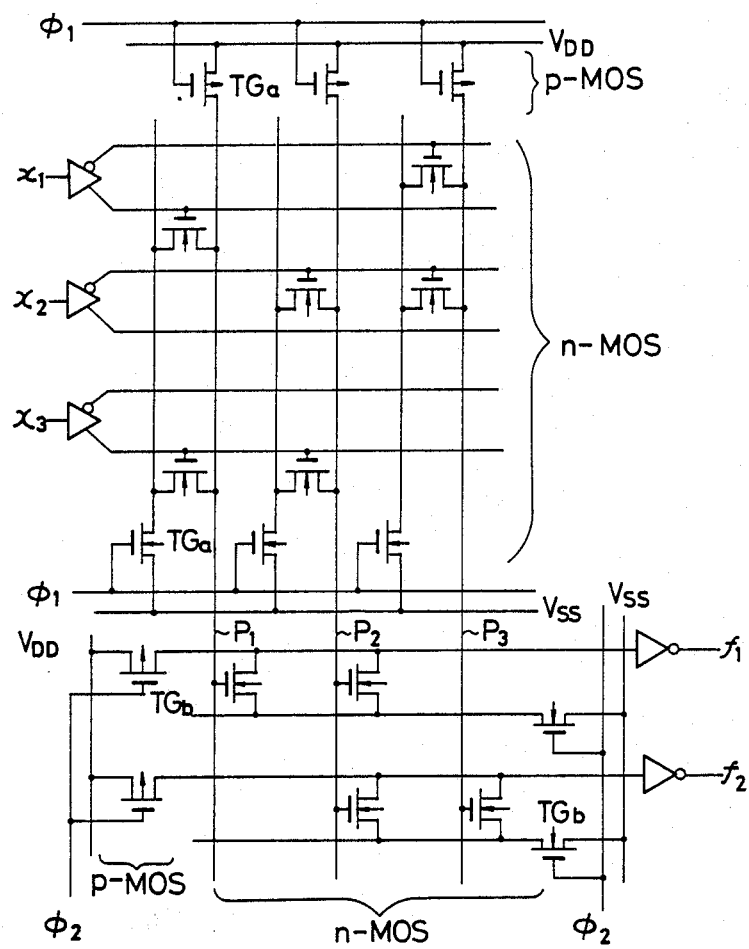
FIG. 1 is a circuit diagram of a conventional PLA circuit which is driven by two pulse signals having a mutual different phase difference.

Referring to FIG. 1, a conventional PLA circuit is driven by clock signals $\phi 1$ and $\phi 2$. Transfer gates TGa associated with an AND array constructed by n-channel MOS transistors are controlled by the pulse signal $\phi 1$. Transfer gates TGb associated with an OR array constructed by n-channel MOS transistors are controlled by the pulse signal $\phi 2$. After the transfer gates TGa are opened by the pulse signal $\phi 1$ and then output signals of product term lines $p_1$, $p_2$ and $p_3$ are stabilized, the pulse signal $\phi 2$ is switched to a high level and then output signals on OR term lines $f_1$ and $f_2$ are read out. The pulse signal $\phi 2$ must lag behind the pulse signals $\phi 1$ by a time which amounts to a time taken for the output signals on the product term lines to be stabilized. This causes the aforementioned first disadvantage. It is noted that the pulse signals $\phi 1$ and $\phi 2$ are generated by an external circuit irrespective of timing at which input signals $x_1$, $x_2$ and $x_3$ are applied to the AND array. This is inconvenient in practical use, as described previously.

Figure 2:
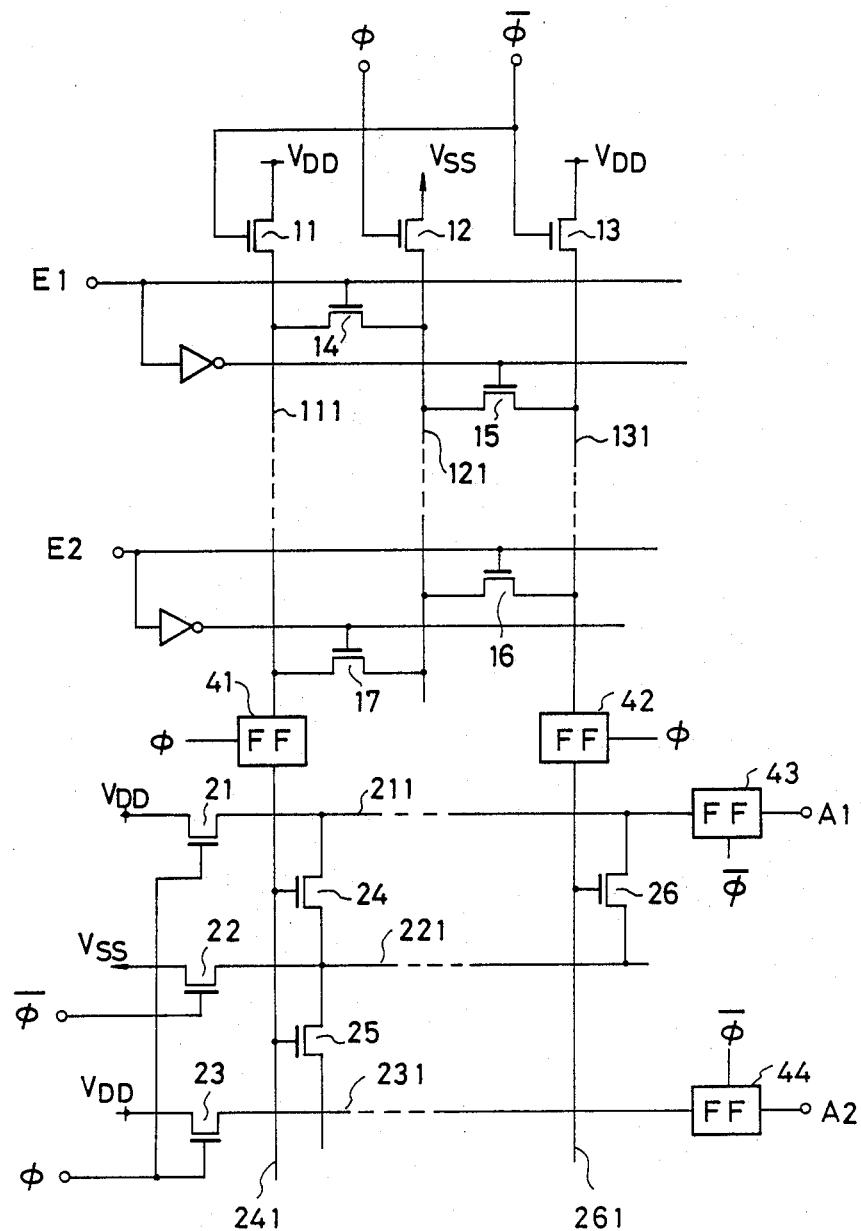
FIG. 2 is a circuit diagram of another conventional PLA circuit which is driven by a single pulse signal.

Referring to FIG. 2, transistors 11 and 13 are turned ON by applying a pulse signal $\phi$ kept at a high level to gates thereof, so that product term lines 111 and 131 are precharged. At this time, a transistor 12 is kept OFF. Then, the pulse signals $\phi$ and $\bar{\phi}$ are switched to the high and low levels, and thereby the transistors 11 and 13 are turned OFF, and the transistor 12 is turned ON. As a result, output logics on the product term lines 111 and 131 are stabilized, and simultaneously flip-flops 41 and 42 are activated. Then the output logics on the product term lines 111 and 131 are supplied to OR input lines 241 and 261 from the flip-flops 41 and 42, respectively.

On the other hand, when the clock signals $\phi$ and $\bar{\phi}$ are held at the high and low levels, respectively, the transistors 24 and 25 are charged up to a positive power source voltage $V_{DD}$. When the clock signals $\phi$, and $\bar{\phi}$ are switched to the low and high levels, the transistors 24 and 25 are allowed to be discharged, so that output logics thereon are stabilized. The stabilized output logics are held in flip-flops 43 and 44 and thereafter are outputted therefrom to an external circuit.

Since the PLA circuit of FIG. 2 is driven by the single pulse signal, the disadvantage arising from the use of the two different pulse signals can be eliminated.

However, the size of the circuit becomes greater, because a number of flip-flops must be used. Further, because the pulse signal is generated by an external circuit irrespective of timing when the input signals E1 and E2 are supplied to the AND array, the input signals E1 and E2 may be applied thereto before the product term lines 111 and 131 are completely precharged to the positive potential $V_{DD}$. In this case, an increased time is taken to discharge the product term lines 111 and 131 to become equal to the low level, and therefore the operation speed becomes slower.

The present invention is intended to overcome the above disadvantages.

A description is given of a preferred embodiment of the present invention.

Figure 3:
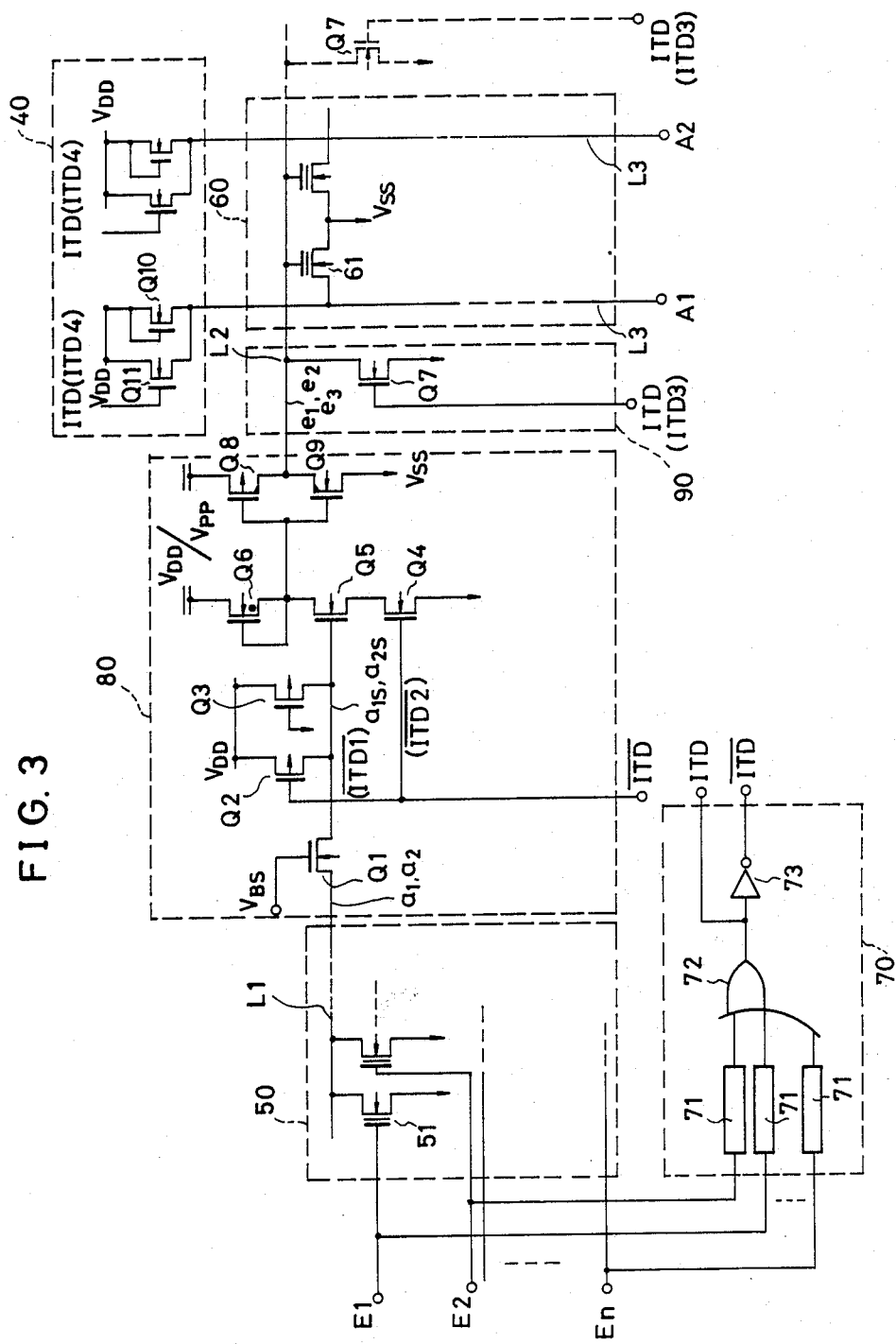
FIG. 3 is a circuit diagram of an essential part of a preferred embodiment of the present invention.

Referring to FIG. 3 which shows an essential part of the preferred embodiment of the present invention, input signals E1, E2, ..., En are supplied to an AND array 50 and a generating circuit 70 for generating input transition detecting signals ITD and $\overline{ITD}$. Hereafter, the generating circuit 70 is simply referred to as an ITD generating circuit. The ITD generating circuit 70 generates pulse signals ITD and $\overline{ITD}$ from input signals E1, E2, ..., En. The AND array 50 includes a number of EPROM cells which are arranged in the form of a matrix. The input signals E1, E2, ..., En are supplied to gates of corresponding EPROM cells 51. A plurality of product (AND) term lines $L1_1$–$L1_n$ extend from the AND array 50. In the following description, a circuit structure of the embodiment with respect to the product term line L1 is mainly described. Circuit structures with respect to the other product term lines are similarly constructed. A transfer gate Q1 constituted by an n-channel MOS transistor included in a product term line buffer 80, is connected to the product term line L1. A bias voltage $V_{BS}$ is supplied to a gate of the n-channel MOS transistor Q1. When the product term line L1 has a value of "1" (a high level), the transfer gate Q1 is cut off. On the other hand, when the product term line L1 has a value of "0" (a low level), the transfer gate L1 is kept ON. Amplitudes of an output of the transfer gate Q1 at "1" and "0" levels can be controlled by the level of the bias voltage applied to the gate of the transfer gate Q1.

A p-channel MOS transistor Q2 included in the product term line buffer 80, is used for precharging the product term line L1 to a predetermined intermediate potential (the power source voltage $V_{DD}$, for example, which is lower than a potential $V_{PP}$). A drain of the MOS transistor Q2 is connected to the product term line L1, and a gate thereof is supplied with the pulse signal $\overline{ITD}$. That is, the MOS transistor is controlled by the pulse signal $\overline{ITD}$.

A p-channel MOS transistor Q3 is a load transistor for always keeping the product term line L1 at a pull-up state. Since the product term lines L1 are designed so as to be precharged by the MOS transistor Q2, the MOS transistor Q3 may be constructed by a MOS transistor having a relatively small mutual conductance $g_m$.

A depletion type n-channel MOS transistor Q6 and an enhancement type n-channel MOS transistor Q4, and an n-channel MOS transistor Q5 construct an n-channel MOS type NAND circuit. A gate of the MOS transistor Q5 is connected to a drain of the transfer gate Q1. A gate of the MOS transistor Q4 is supplied with the pulse signal $\overline{ITD}$ which is used for discharging a portion of the product term line L1 located on the side of an OR array 60. An output terminal of the NAND circuit is connected to a CMOS inverter made up of p-channel MOS transistor Q8 and an n-channel MOS transistor Q9. The CMOS inverter is used for driving an OR array input line which is an input line of the OR array 60.

An n-channel MOS transistor Q7 included in a discharge circuit 90, is used for facilitating the discharge of the OR array input line L2. A drain of the MOS transistor Q7 is connected to the OR array input line L2, and a source thereof is connected to a negative power source voltage $V_{SS}$. A gate of the MOS transistor Q7 is supplied with the pulse signal ITD, so that the MOS transistor Q7 is controlled by the pulse signal ITD. Although the MOS transistor Q7 is shown so that it is located on the input side of the OR array 60 and is connected to an end of the OR array input line L2 for the sake of simplicity, it is preferable to be located on the opposite side shown by a symbol represented by broken lines and to be connected to the other end of the OR array input line L2. It may be considered that a portion of the OR array input line L2 on the input side of the OR array 60 is discharged by the MOS transistor Q4. Therefore, it is preferable to discharge a portion of the OR array input line L2 on the opposite side of the OR array 60 by the MOS transistor Q7 connected thereto.

The OR array 60 contains a plurality of n-channel EPROM cells 61, gates of which are connected to a corresponding OR array input line (a word line). A node of a pair of EPROM cells 61 mutually connected is supplied with the negative source voltage $V_{SS}$. Two outputs of the pair of EPROM cells 61 are connected to corresponding OR array output lines L3 (A1, A2). Each of the OR array output lines L3 is connected to n-channel MOS transistors Q10 and Q11 included in an output buffer circuit 40. The MOS transistor Q11 is used for precharging the corresponding OR array output line L3 to an predetermined intermediate potential (voltage $V_{DD}$ in the present embodiment). The MOS transistor Q10 is used for always keeping the corresponding OR array output line L3 at the intermediate potential like the MOS transistor Q3.

The ITD generating circuit 70 includes detecting circuits 71, which receives one of the input signal E1-En. The detecting circuits 71 detect potential changes of the respective input signals E1-En. All the output signals of the detecting circuits 71 are supplied to an OR circuit 72. An output signal of the OR circuit 72 is the ITD signal, which is supplied to the MOS transistors Q7 and Q11. The ITD signal from the OR circuit 72 is supplied to an inverter circuit 73, which produces the $\overline{ITD}$ signal.

Figure 4:
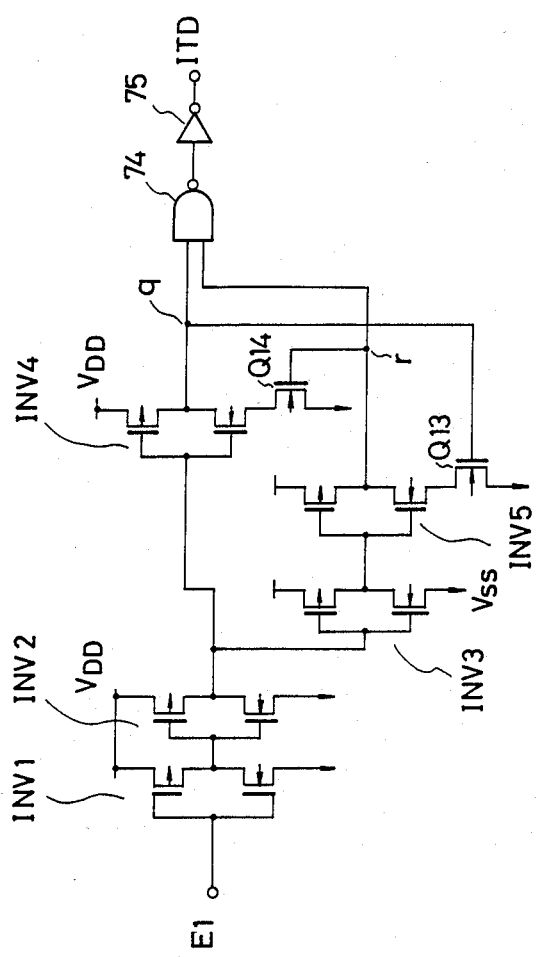
FIG. 4 is a circuit diagram of a detection circuit 71 used for detecting a change of a level of an input signal shown in FIG. 3.
Figure 5:
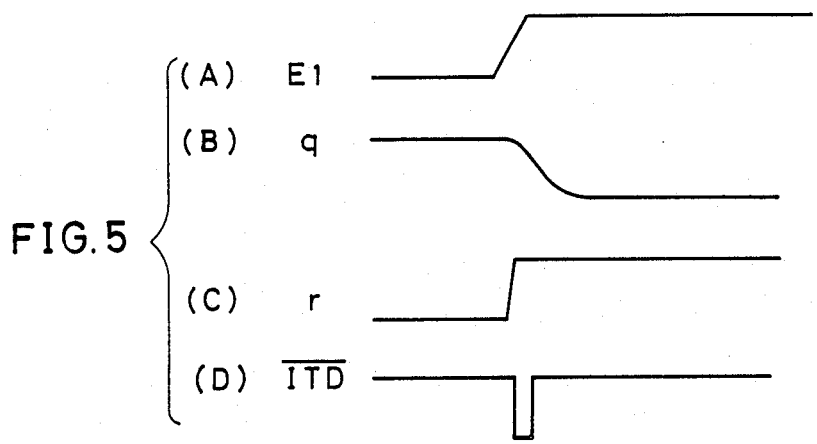
FIGS. 5(A) through 5(D) show signal waveforms at different portions of the detection circuit shown in FIG. 4.

Each of the detecting circuits 71 is constructed as shown in FIG. 4. The detecting circuit 71 includes inverter circuits INV1-INV5. The inverter circuits INV1 and INV2 are cascaded. An input terminal of each of the inverter circuits INV3 and INV4 is connected to an output terminal of the inverter circuit INV2. An output terminal of the inverter circuit INV3 is connected to an input terminal of the inverter circuit INV5. A drain of an n-channel MOS transistor Q13 is connected to a source of an n-channel MOS transistor contained in the inverter circuit INV5. Similarly, a drain of an n-channel MOS transistor Q14 is connected to a source of an n-channel MOS transistor contained in the inverter circuit INV4. When the input signal E1 is switched to the high-level as shown in FIG. 5(A), the potential at a node "q" is changed as shown in FIG. 5(B), and the potential at a node "r" is changed as shown in FIG. 5(C). A NAND circuit 74 performs an NAND operation for the signals shown in FIGS. 5(B) and 5(C). An output signal of the NAND circuit 74 is supplied to an inverter circuit 75, which then produces an output signal as shown in FIG. 5(D) which is the ITD signal. The ITD signal thus produced is supplied to the MOS transistors Q2 and Q4 shown in FIG. 3.

A description is given of an operation of the above embodiment.

When any of the input signals E1-En is changed in level, the ITD signal derived from the ITD Thereby the MOS transistor Q2 is turned ON and the MOS transistor Q4 is turned OFF, and thus the product term line L1 is precharged to the voltage $V_{DD}$. At this time, the other product term lines are also precharged. Then output logics on the product term lines L1 are stabilized, depending on level changes of the input E1-En. For example, when the input signal E1 is switched to the high level, the MOS transistor 51 which receives the input signal E1 is turned ON, and therefore the product term line L1 is switched to the low level. It is noted that the output logic of the product term line L1 is rapidly stabilized to the low level, because the product term line L1 has been precharged to the potential $V_{DD}$. When the input signal E1 is switched to the low level, the MOS transistor 51 is turned OFF, and therefore the product term line L1 is rapidly stabilized to the high level.

Thereafter, when the ITD signal is switched to the high level, the MOS transistor Q2 is turned OFF, and the MOS transistor Q4 is turned ON. Then the output logic on the product term line L1 is sensed by the NAND circuit composed of the MOS transistors Q4 to Q6. The sensed output logic is supplied to the OR array input line L2 through the inverter circuit composed of the MOS transistors Q8 and Q9.

Figure 6:
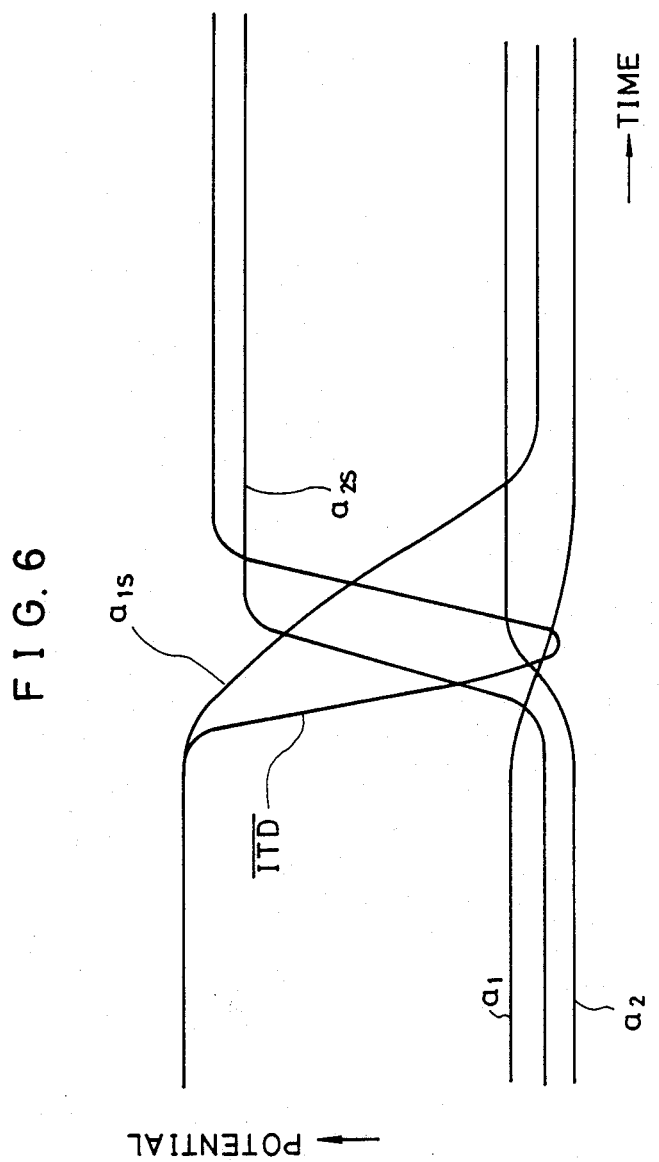
FIG. 6 shows signal waveforms measured at the source and train of an n-channel MOS transistor Q1 shown in FIG. 3.

Referring to FIG. 6, signals $a_1$ and $a_2$ are signals measured at the source of the transfer gate Q1, and signals $a_{1s}$ and $a_{2s}$ are signals measured at the drain of the transfer gate Q1. As shown, when the ITD signal is switched to the low level, the change of the signal $a_1$ from the low to high level is very rapidly sensed, so that the signal $a_{1s}$ can be obtained. Similarly, when the ITD signal is switched to the low level, the change of the signal $a_2$ from the high to low level is also rapidly sensed, so that the signal $a_{2s}$ can be obtained.

When the product term line L1 is precharged before the level of the product term line L1 is stabilized, the gate of the MOS transistor Q7 is supplied with the ITD signal which is switched to the high level or "1". Thereby, the MOS transistor Q7 is turned ON and thereby the OR array input line L2 is rapidly discharged. In other words, all the EPROM cells 61 of the OR array 60 are cut off. Further, the ITD signal is supplied to the gate of the MOS transistor Q11, and thereby the MOS transistor Q11 is turned ON. Thus, all the OR array output lines L3 are precharged up to the potential $V_{DD}$. It should be appreciated when the product term lines L1 are precharged, all the OR array input lines L2 are discharged, and all the OR array output lines L3 are precharged. This is one of the essential features of the present invention, and contributes to speeding up the operation of the PLA circuit.

Then, the sensed output logic is applied to the OR array input line L2 which has been discharged. Then the OR array output lines A1 and A2 out of the OR array output lines L3 are rapidly switched to corresponding levels from the precharged level.

Figure 7:
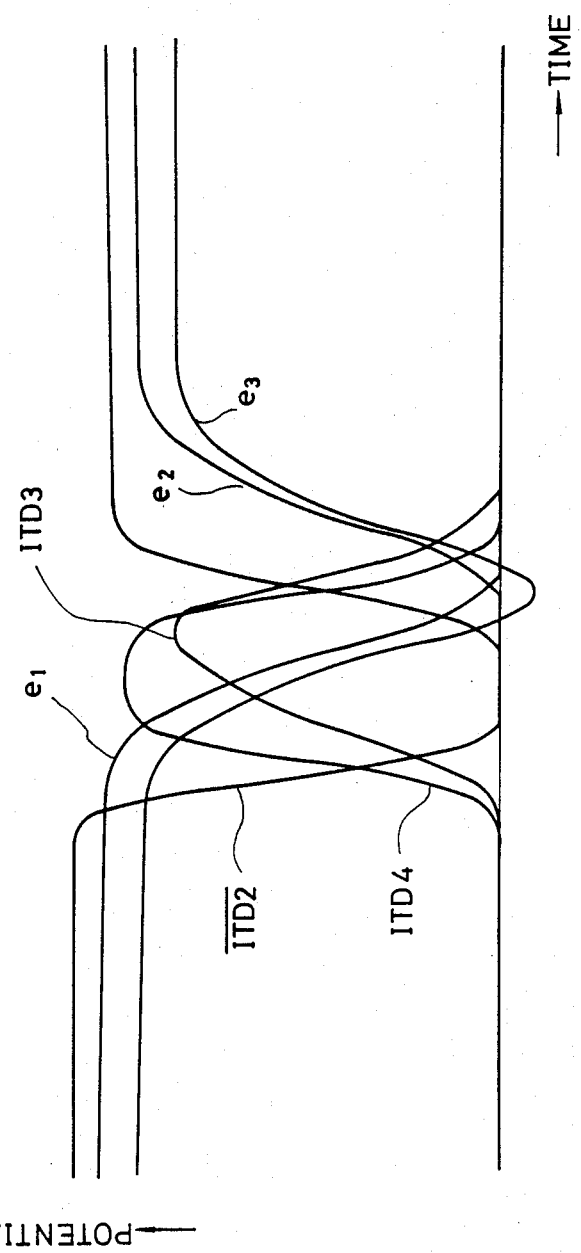
FIG. 7 shows signal waveforms measured at an output of an inverter made up of MOS transistors Q8 and Q9.

Referring to FIG. 7, a signal $\overline{ITD2}$ is the $\overline{ITD}$ signal applied to the MOS transistor Q4, and a signal ITD3 is the ITD signal applied to the MOS transistor Q11. Signals $e_1$ and $e_2$ are signals measured at the output of the inverter circuit made up of the MOS transistors Q8 and Q9. The signals $e_1$ and $e_2$ are with respect to the signals $a_{1s}$ and $s_{2s}$, respectively. A signal ITD4 is the ITD signal applied to the MOS transistor Q11 used for charging the OR array output line L1 up to the potential $V_{DD}$. A signal $e_3$ is a signal of a product term line which is always fixed to the high level and which is one of the product term lines L1.

Figure 8:
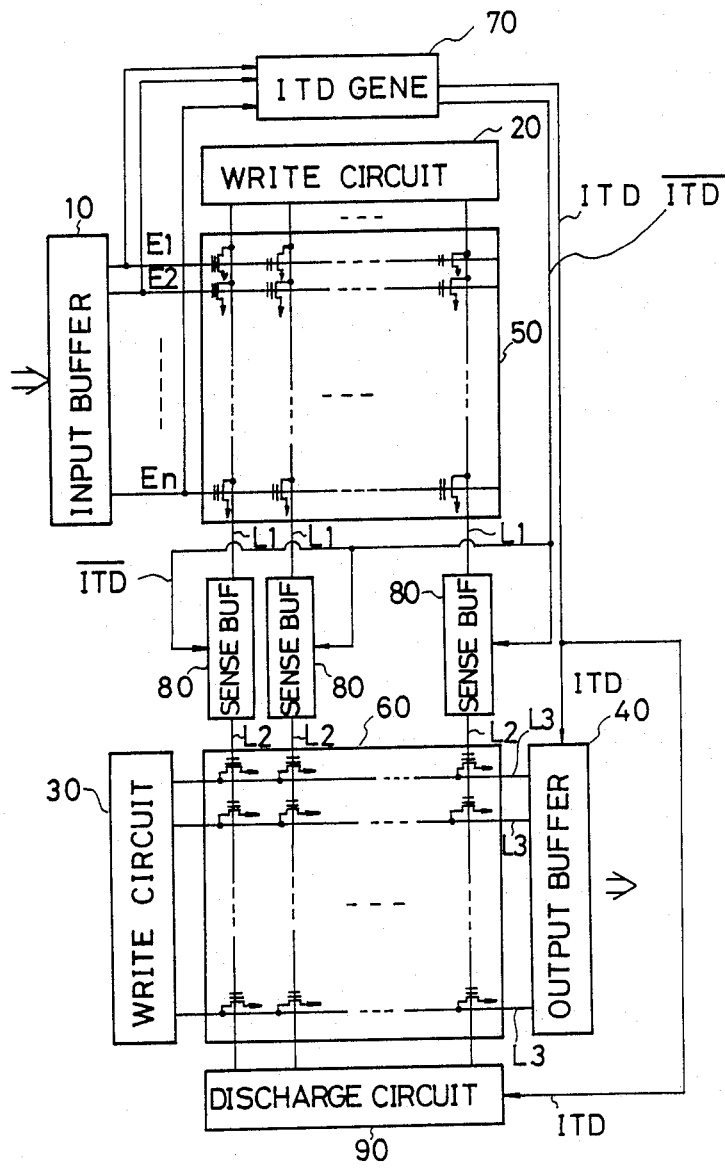
FIG. 8 is a block diagram of the entire structure of a preferred embodiment of the present invention.

A description is given of the entire structure of the PLA circuit according to the embodiment of the present invention with reference to FIG. 8.

Referring to FIG. 8, input signals E1 to En are supplied to the AND array 50 through an input buffer 10. The input buffer 10 can be constituted by a conventional input buffer. The input signals E1 to En are supplied also to the ITD generating circuit 70 having the circuit structure shown in FIG. 4. A write-in circuit 20, which may be constituted by a conventional write-in circuit, is connected to the AND array 50. The product term lines L1 extending from the AND array 50 are connected to the corresponding product term line buffers 80. Each of the product term line buffers 80 is supplied with the $\overline{ITD}$ signal derived from the ITD generating circuit 70. The OR array input lines L2 extending from the product term line buffers 80 extend to the OR array 60. The discharge circuit 90 which includes the MOS transistors Q7 shown in FIG. 3 for the respective OR array input lines L2, are provided on the side of the OR array 60 opposite to the product term line buffers 80. The discharge circuit 90 is supplied with the ITD signal derived from the ITD generating circuit 70. A write-in circuit 30, which may be constituted by a conventional write-in circuit, is connected to the OR array 60. The OR array output lines L3 extending from the OR array 60 are connected to an output buffer circuit 40 which includes the MOS transistors Q10 and Q11 for each of the OR array output lines L3. The output buffer circuit 40 is supplied with the ITD signal derived from the ITD circuit 70.

Figure 9:
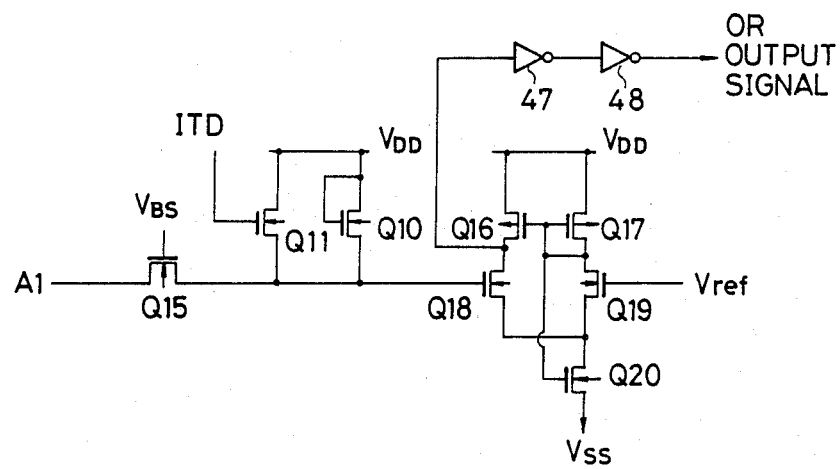
FIG. 9 is a circuit diagram of an output buffer circuit 40 shown in FIG. 8.

FIG. 9 is a circuit diagram of a portion of the output buffer circuit 40, which is provided for each of the OR array output lines L3. The OR array output line A1 is connected to a sense amplifier through a transfer gate of an n-channel MOS transistor Q15. A gate of the MOS transistor Q15 is supplied to the bias voltage $V_{BS}$. A drain of the MOS transistor Q15 is connected to the sources of n-channel MOS transistors Q10 and Q11. The MOS transistor Q10 is used for always pulling the OR array output line A1 up to the potential $V_{DD}$. The MOS transistor Q11 is controlled by the ITD signal, and is used for precharging the OR array output line A1 to the potential $V_{DD}$. The sense amplifier is made up of p-channel MOS transistors Q16 and Q17, and n-channel MOS transistors Q18, Q19 and Q20. The illustrated sense amplifier is of the current mirror type. A gate of the MOS transistor Q19 is supplied with a reference voltage Vref, and a gate of the MOS transistor Q18 is connected to the drain of the MOS transistor Q15. When the potential at the gate of the MOS transistor Q18 is greater than the reference potential Vref, the sense amplifier produces an output signal held at the low level. On the other hand, when the potential at the gate of the MOS transistor Q18 is smaller than the reference potential Vref, the sense amplifier produces the output signal held at the high level. The OR output signal is extracted from a node of the MOS transistors Q16 and Q18, and is outputted an external circuit through inverter circuits 47 and 48.

Figure 10:
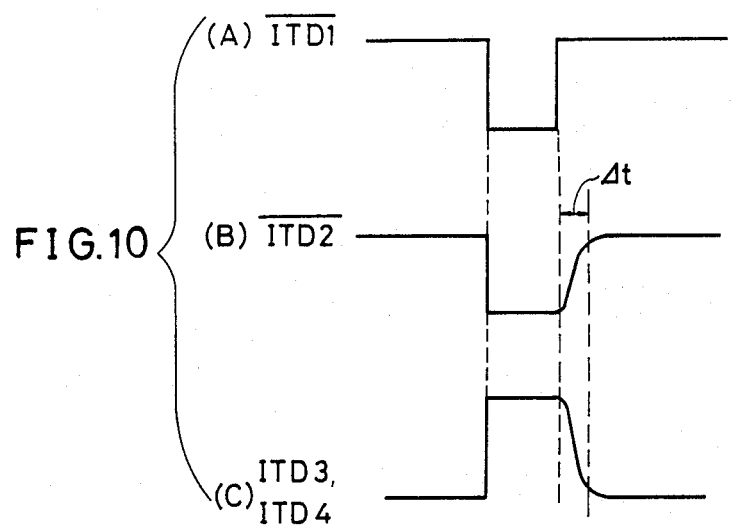
FIGS. 10(A) through 10(C) show signal waveforms used in another preferred embodiment of the present invention.

In the above embodiment, the ITD and $\overline{ITD}$ signals are used. In place of the ITD and $\overline{ITD}$ signals, signals $\overline{ITD1}$, $\overline{ITD2}$, ITD3 and ITD4 as shown in FIG. 10 may be used. The signal $\overline{ITD1}$ is the pulse signal which is supplied to the gate of the MOS transistor Q2 shown in FIG. 3. The signal $\overline{ITD2}$ is the pulse signal which is supplied to the gate of the MOS transistor Q4 shown in FIG. 3. The signals ITD3 and ITD4 are pulse signals supplied to the gates of the MOS transistors Q7 and Q11, respectively. It is noted that although the $\overline{ITD2}$ signal falls and the ITD3 and ITD4 signals rise at the same time when the $\overline{ITD1}$ signal falls. On the other hand, the $\overline{ITD2}$ signal rises and the ITD3 and ITD4 signals fall after the $\overline{ITD1}$ signal rises. In other words, the trailing edges of the $\overline{ITD2}$, ITD3 and ITD4 signals lag behind the $\overline{ITD1}$ signal by a time it. The pulse signal supplied to the MOS transistor Q2 is used for controlling the charging-up operation for the product term lines L1. On the other hand, the pulse signal supplied to the MOS transistor Q4 is used for controlling the discharging operation for the OR array input lines L2. Therefore it takes a little more time to charge up the product term lines L1 than to discharge the OR array input lines L2. Since the MOS transistor Q7 is used for discharging the OR array input lines L2, the ITD3 signal having the pulse width identical to that of the ITD2 signal. The ITD4 signal has a pulse width identical to that of the ITD3 signal, because the OR array output lines L3 are charged up while the OR array input lines L2 are discharged.

Figure 11:
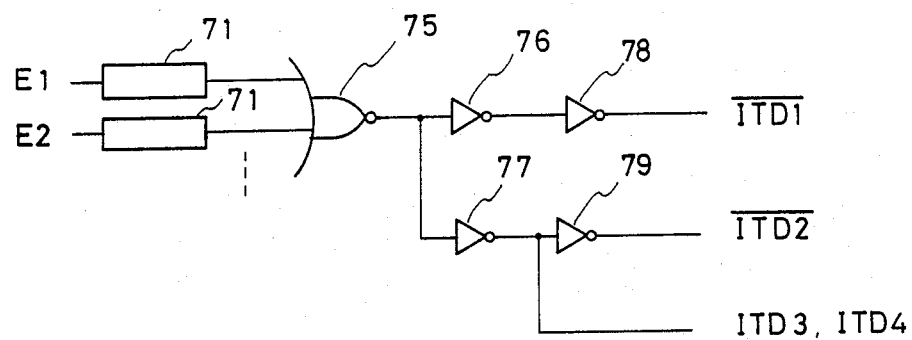
FIG. 11 is a circuit diagram of an ITD generating circuit which generates the signals shown in FIGS. 10(A) through 10(C)

The $\overline{ITD1}$, $\overline{ITD2}$, ITD3 and ITD4 can be generated by a circuit shown in FIG. 11, with which the ITD generating circuit 70 shown in FIG. 3 is substituted. The detecting circuit 71 of FIG. 11 has the circuit structure shown in FIG. 4. All the output signals of the detecting circuits 71 are supplied to a NOR circuit 75, an output of which is then supplied to inverter circuits 76 and 77. An output signal of the inverter circuit 77 is used as the ITD3 and ITD4 signals. Output of the inverter circuits 76 and 77 are supplied to inverter circuits 78 and 79, respectively. The inverter circuit 78 produces the $\overline{ITD1}$ signal. The inverter circuit 79 produces the $\overline{ITD2}$ signal.

Figure 12:
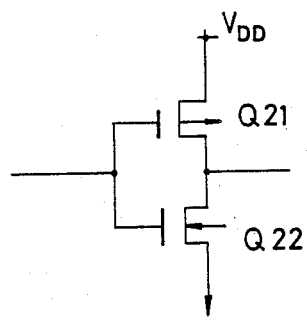
FIG. 12 is a circuit diagram of an inverter circuit which may be used in the circuit of FIG. 11.

Each of the inverter circuit 76 to 79 is constituted by a CMOS inverter consisting of a p-channel MOS transistor Q21 and an n-channel MOS transistor Q22 shown in FIG. 12. The mutual conductances $g_m$ of the MOS transistors Q21 and Q22 in each of the inverter circuits 76, 78 and 79 are almost identical to each other. On the other hand, the mutual conductance $g_m$ of the p-channel MOS transistor Q21 of the inverter circuit 77 is greater than the n-channel MOS transistor Q22 of the inverter circuit 77. When the input signal of the inverter circuit 77 is switched to the high level, the output signal thereof falls gradually.

Figure 13:
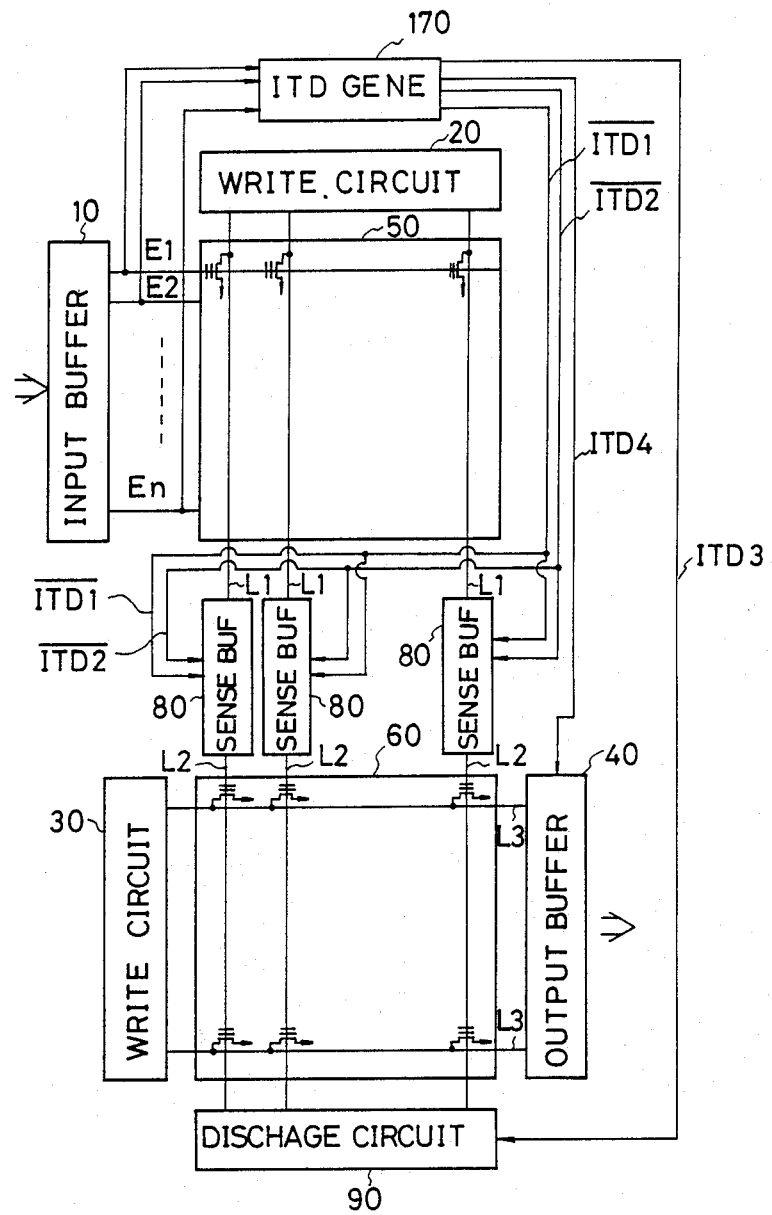
FIG. 13 is a block diagram of the entire structure of another embodiment of the present invention.

FIG. 13 is a block diagram of the entire structure of another embodiment of the present invention in which the $\overline{ITD1}$, $\overline{ITD2}$, ITD3 and ITD4 signals are used. Referring to FIG. 13, an ITD generating circuit 170, which has the circuit structure shown in FIGS. 11 and 12, produces $\overline{ITD1}$, $\overline{ITD2}$, ITD3 and ITD4 signals. The $\overline{ITD1}$ and $\overline{ITD2}$ signal are supplied to each of the product term line buffers 80. The ITD3 signal is supplied to the discharge circuit 90, and the ITD4 signal is supplied to the output buffer circuit 40.

The present invention is not limited to the embodiments, and variations and modifications may be made without departing from the scope of the present invention. For example, although the aforementioned embodiments utilize CMOS-FET, the present invention includes a PLA circuit which is made up of single-channel type FETs.

What is claimed is:

1. A programmable logic array circuit comprising:
an AND array comprising a plurality of memory cells connected to input lines and product term lines, input signals being supplied to the AND array through the input lines;
an OR array comprising a plurality of memory cells connected to OR array input lines and OR array output lines, output signals being extracted through the OR array output lines;
pulse signal generating means for generating a pulse signal by detecting a change in levels of the input signals;
product term sensing buffer means for sensing levels of the product term lines, sensed levels being sent to the OR array through the OR array input lines, the product term sensing buffer means comprising first precharging means for charging the product term lines up to a predetermined potential in response to the pulse signal derived from the pulse signal generating means, and discharging means for discharging the OR array input lines in response to the pulse signal derived from the pulse signal generating means; and
second precharging means for charging the OR array input lines up to a predetermined potential in response to the pulse signal derived from the pulse signal generating means.

2. A programmable logic array circuit as claimed in claim 1, further comprising second discharging means for discharging the OR array input lines in response to the pulse signal derived from the pulse signal generating means, in addition to the first discharging means provided included in the product term sensing buffer.

3. A programmable logic array circuit as claimed in claim 2, wherein each of the first and second precharging means comprises a metal oxide semiconductor (MOS) transistor, wherein each of the first and second discharging means comprises a MOS transistor, and wherein gates of the MOS transistors of the first and second precharging and discharging means are supplied with the pulse signal.

4. A programmable logic array circuit as claimed in claim 2, wherein the pulse signal generating means generates the pulse signal which consists of a first pulse signal and a second pulse signal, and wherein the first pulse signal is a low-active signal, and wherein the second pulse signal corresponds to a pulse signal obtained by inverting the first pulse signal, and wherein either one of the first and second pulse signals is supplied to each of the first and second precharging and discharging means.

5. A programmable logic array circuit as claimed in claim 4, wherein the first precharging means comprises an n-channel MOS transistor provided for each of the product term lines, and the first discharging means comprises a p-channel MOS transistor provided for each of the OR array input lines, and wherein the first pulse signal is supplied to the gate of the n-channel MOS transistor of the first precharging means and to the gate of the p-channel MOS transistor of the first discharging means.

6. A programmable logic array circuit as claimed in claim 4, wherein the second precharging means comprises an n-channel MOS transistor provided for each of the OR array output lines, and the second discharging means comprises an n-channel MOS transistor provided for each of the OR array input lines, and wherein the second pulse signal is supplied to the gates of the n-channel MOS transistors of the second precharging and discharging means.

7. A programmable logic array circuit as claimed in claim 2, wherein the second discharging means is located at an end of the OR array input lines opposite to an end where the product term sensing buffer means is connected to the OR array input lines.

8. A programmable logic array circuit as claimed in claim 4, wherein the pulse signal generating means comprises detecting means provided for each of the input signals for detecting a change in levels of the input signals; an OR circuit for receiving all the output signals of the detecting means, an output signal of the OR circuit being the second pulse signal; and an inverter circuit for inverting the output signal of the OR circuit, an output signal of the inverter circuit being the first pulse signal.

9. A programmable logic array circuit as claimed in claim 1, further comprising a first pull-up means for pulling the product term lines to the predetermined potential, and a second pull-up means for pulling the OR array output lines to the predetermined potential.

10. A programmable logic array circuit as claimed in claim 8, wherein the detecting means comprises first and second inverter circuits which are cascade-connected; third and fourth inverter circuits each being connected to an output terminal of the second inverter circuit; fifth inverter circuit being connected to an output terminal of the third inverter circuit; and first and second MOS transistors for controlling the fourth and fifth inverter circuits, respectively, and wherein a gate of the first MOS transistor is connected to an output terminal of the fifth inverter circuit, and a gate of the second MOS transistor is connected to an output of the fourth inverter circuit, and wherein the detecting means further comprises an NAND circuit connected to the output terminals of the fourth and fifth inverter circuits; and an inverter circuit connected to an output terminal of the NAND circuit.

11. A programmable logic array circuit as claimed in claim 2, wherein the pulse signal generating means generates the pulse signal which consists of first, second, third and fourth pulse signals, and wherein the first and second pulse signals are low-active signals, and wherein a trailing edge of each of the second, third and fourth pulse signals lags behind a trailing edge of the first pulse signal, and wherein the first and second pulse signals are supplied to the first precharging and discharging means, respectively, and wherein the third and fourth pulse signals are supplied to the second discharging and precharging means, respectively.

12. A programmable logic array circuit as claimed in claim 11, wherein the pulse signal generating means comprises detecting means provided for each of the input signals for detecting a change in levels of the input signals; a NOR circuit for receiving all the output signals of the detecting means, an output signal of the NOR circuit being the first pulse signal; a first inverter circuit for inverting the output signal of the NOR circuit, an output signal of the first inverter circuit being the third and fourth pulse signals; and a second inverter circuit for inverting the output signal of the first inverter circuit, an output signal of the second inverter circuit being the second pulse signal.

13. A programmable logic array circuit as claimed in claim 12, wherein the pulse signal generating means comprises a buffer circuit composed of two cascaded inverters, and wherein first pulse signal derived from the NOR circuit is supplied to an input of the buffer circuit, so that an output signal of the buffer circuit is supplied to the first precharging means as the first pulse signal.

* * * * *

UNITED STATES PATENT AND TRADEMARK OFFICE
CERTIFICATE OF CORRECTION

PATENT NO. : 4,893,033
DATED : January 9, 1990
INVENTOR(S) : ITANO et al

It is certified that error appears in the above-identified patent and that said Letters Patent is hereby corrected as shown below:

On the cover page, after Item [76], add the following:

--[73] Assignees: Fujitsu Limited, Kawasaki; Fujitsu VLSI Limited, Kasugai, both of Japan--.

Signed and Sealed this

Second Day of April, 1991

Attest:

HARRY F. MANBECK, JR.

Attesting Officer

Commissioner of Patents and Trademarks